United States Patent
Onizuka et al.

(10) Patent No.: US 6,911,598 B2
(45) Date of Patent: Jun. 28, 2005

(54) CASING UNIT FOR CIRCUIT ASSEMBLY AND METHOD FOR PRODUCING THE CIRCUIT ASSEMBLY

(75) Inventors: Takahiro Onizuka, Yokkaichi (JP); Jun Yamaguchi, Yokkaichi (JP)

(73) Assignee: Sumitomo Wiring Systems, Ltd., Mie (JP)

(*) Notice: Subject to any disclaimer, the term of this patent is extended or adjusted under 35 U.S.C. 154(b) by 41 days.

(21) Appl. No.: 10/694,756

(22) Filed: Oct. 29, 2003

(65) Prior Publication Data

US 2004/0159455 A1 Aug. 19, 2004

(30) Foreign Application Priority Data

Feb. 14, 2003 (JP) ...................................... 2003-036467

(51) Int. Cl.[7] .................................................. H02G 3/08
(52) U.S. Cl. ...................... 174/50; 174/52.1; 174/52.4; 174/58; 174/60; 361/752; 439/535; 248/906
(58) Field of Search ........................ 174/50, 52.1, 52.4, 174/58, 60; 220/3.2, 4.02; 359/290; 361/752, 760; 439/535; 248/906

(56) References Cited

U.S. PATENT DOCUMENTS

| | | | | |
|---|---|---|---|---|
| 6,350,949 B1 | * | 2/2002 | Boyd | 174/50.5 |
| 6,570,088 B1 | * | 5/2003 | Depp et al. | 174/50 |
| 6,583,353 B2 | * | 6/2003 | Murakoshi et al. | 174/50 |
| 6,600,658 B2 | * | 7/2003 | Iwata | 361/752 |
| 6,674,645 B2 | * | 1/2004 | Anzai et al. | 361/752 |
| 6,677,521 B2 | * | 1/2004 | Sumida et al. | 174/50 |
| 6,704,131 B2 | * | 3/2004 | Liu | 359/290 |

FOREIGN PATENT DOCUMENTS

JP    A 11-204700    7/1999

* cited by examiner

*Primary Examiner*—Dhiru R Patel
(74) *Attorney, Agent, or Firm*—Oliff & Berridge, PLC

(57) ABSTRACT

A power circuit section is adhered to a circuit arrangement surface on a heat radiation member to form a circuit assembly. A casing body is mounted on the heat radiation member. The casing body is provided with an opening that exposes at least the upper portion of the power circuit section. A shape retention member is disposed across the opening for interconnecting a peripheral edge of the opening to each other at a plurality of positions. A casing unit is made of a synthetic resin. The shape retention member suppresses a deformation of the casing body due to a shrinkage cavity. After cooling the casing unit, the shape retention member is removed to define a large opening, if desired.

11 Claims, 5 Drawing Sheets

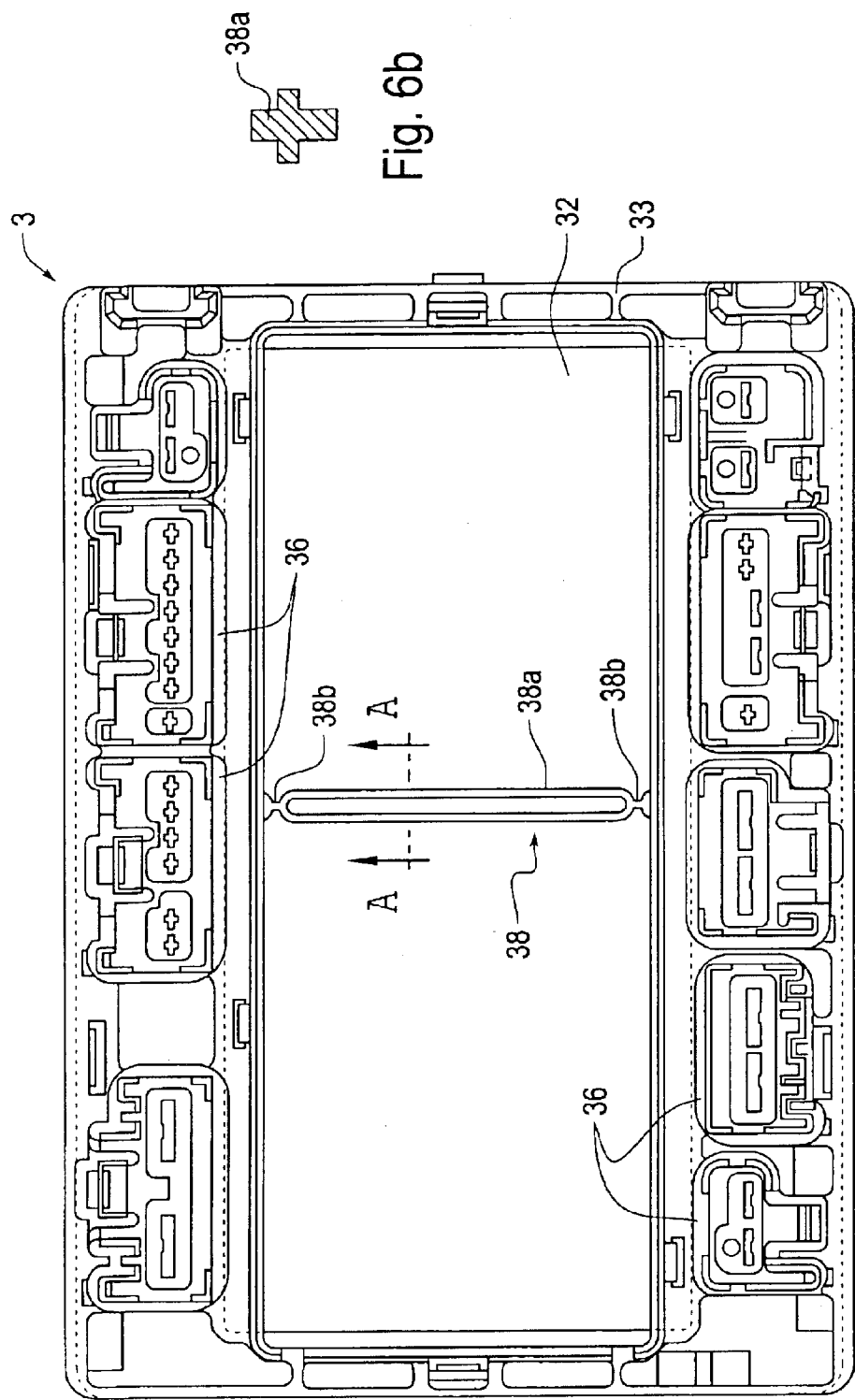

CASING UNIT FOR CIRCUIT ASSEMBLY AND METHOD FOR PRODUCING THE CIRCUIT ASSEMBLY

CLAIM FOR PRIORITY

The present invention claims priority to Japanese Patent Application JP-A2003-036467 filed Feb. 14, 2003.

BACKGROUND OF THE INVENTION

1. Field of Invention

This invention relates to a casing unit for a circuit assembly that can be used as a power distributor on a vehicle for distributing an electrical power to a plurality of electronic units from a common power source on a vehicle, and also relates to a method for producing the circuit assembly.

2. Description of Related Art

Heretofore, as means for distributing an electrical power to each electronic unit from a common power source on a vehicle, a junction box has been known which constitutes a power circuit section in which a plurality of bus bar boards are laminated and a fuse and a relay switch are incorporated on the boards.

Recently, in order to downsize a junction box for distributing an electrical power to each electronic unit and to realize a high speed switching control, a circuit assembly in which a switching device such as an FET (a field-effect transistor) or the like has been developed to be interposed between an input terminal and an output terminal. It will be preferable to cool down the hot switching device in the circuit assembly effectively. In view of this cooling action, a circuit assembly has been proposed in which a power circuit section is stuck through an insulation layer on a circuit arrangement area on a circuit arrangement surface of a heat radiation member made of an aluminum or the like having good heat conduction. See, for example, Japanese Patent Public Disclosure No. HEI 11-204700.

In the circuit assembly in which the power circuit section is adhered to the circuit arrangement surface of the heat radiation member, for example, it is necessary to protect the power circuit section by a casing body. In this case, the power circuit section is pressed on the circuit arrangement surface from the outside of the casing to ensure a sticking condition after mounting the casing body on the heat radiation member and an inspection of a circuit condition is carried out after mounting the casing body on the heat radiation member. It will be necessary to provide an opening having a certain size in the casing body to expose the power circuit section outwardly.

On the other hand, the casing body can be mass-produced by pouring a heated molten synthetic resin into a mold. However, if a large opening is provided in the casing body, the casing body might be deformed because of a shrinkage cavity caused upon cooling after forming. There is a possibility of encountering a difficult assembling in the worst case.

An object of the embodiments of the present invention is to provide a circuit assembly including a casing unit having a good configuration and a method for producing the circuit assembly.

SUMMARY OF THE INVENTION

In order to achieve the above object, the various embodiments of the present invention is directed to a casing unit wherein a power circuit section is adhered to a circuit arrangement surface on a heat radiation member to form a circuit assembly and a casing body is mounted on said heat radiation member. The casing unit includes a casing body for covering a side portion or an upper portion of the power circuit section adhered to the circuit arrangement surface and being provided with an opening that exposes at least the upper portion of the power circuit section, and shape retention member disposed across the opening for interconnecting a peripheral edge around the opening to each other at a plurality of positions. The casing body and shape retention member are made of a synthetic resin integrally with each other.

The phrase "a casing body for covering a side portion or an upper portion of the power circuit section adhered to the circuit arrangement surface and being provided with an opening that exposes at least the upper portion of the power circuit section" does not only specify positions of the casing unit and circuit assembly in use. The words do not exclude use of the circuit assembly in which the opening faces downwardly in accordance with a specification.

According to the above casing unit, at least a part of the power circuit section is covered with and protected by the casing body. It is possible to enhance adherence (to enhance a close contact) between the power circuit section and the circuit arrangement surface of the heat radiation member by pressing the power circuit section on the circuit arrangement surface through the opening in the casing body. The opening facilitates inspection of the power circuit section. Because the shape retention member interconnects the periphery around the opening at a plurality of positions across the opening, it is possible to prevent the casing unit from being deformed due to a shrinkage cavity in spite of the large opening.

The casing unit can be used as the casing body for the circuit assembly, as it is. However, if the shape retention member is removed at a suitable time after forming and cooling, pressing and inspecting works of the power circuit section will be easier.

In the case where the breakable reduced portion is provided on a boundary area or an adjacent area between the shape retention member, and where the peripheral edge of the opening and a cross section of the breakable reduced portion is smaller than that of a member body of the shape retention member, it is possible to cut off the shape retention member from the casing unit more easily by utilizing the reduced breakable portion.

A structure of the casing unit of the embodiments of the present invention is not limited. For example, so long as a plurality of connector housings are integrally provided on the peripheral edge around the opening in the casing body to interconnect the power circuit section and an external circuit to each other, and the opening is formed at an inside of the connector housing, the casing unit will be any structure. While interconnecting the power circuit section and the external circuit to each other by utilizing the respective connector housings, the opening is disposed at the inside of the connector housings arranged on the periphery of the casing body and the large opening can be obtained while keeping a compact structure. Because the connector housing increases a thickness of the casing body, which prevents the shrinkage cavity upon cooling after forming, the shape retention member will further prevent the shrinkage cavity significantly.

A method of the embodiments of the present invention produces a casing unit wherein a power circuit section is adhered to a circuit arrangement surface on a heat radiation member to form a circuit assembly and a casing body is mounted on the heat radiation member. The method includes forming a casing unit by filling a heated molten synthetic resin into a mold, and removing a shape retention member from the casing unit after cooling the casing unit.

According to the method, it is possible to suppress deformation of the casing unit from a shrinkage cavity after forming. This deformation suppression is achieved by the shape retention member without using a special tool, while achieving a mass-production by a common forming method in which a heated molten synthetic resin is poured into a mold. It is possible to perform a work through the opening (a work of pressing the power circuit section and an inspection work) smoothly by cutting off the shape retention member from the casing unit after cooling.

The phrase "cooling the casing unit" means to cool the casing unit to a temperature at which the casing unit is not deformed because of the shrinkage cavity. The temperature and a period in time for finishing the cooling step depend on a material and a shape of the casing unit.

A method of the embodiments of the present invention produces a circuit assembly wherein a power circuit section having a power circuit is adhered to a heat radiation member and a synthetic resin casing body is mounted on the heat radiation member to protect the power circuit section from the outside. The method includes producing the power circuit section, the heat radiation member, and a casing unit, respectively, and adhering the power circuit section to the heat radiation member and adhering the casing unit to the heat radiation member. The first step of producing the power circuit section includes forming the casing unit including the shape retention member by filling a heated molten synthetic resin into a mold, and a phase of removing the shape retention member from the casing unit after cooling the casing unit and before finishing the second step of adhering. The second step of adhering includes pressing the power circuit section toward the heat radiation member through the opening from which the shape retention member is removed, with an adhesive being interposed between the power circuit section and the heat radiation member, thereby enhancing a close contact between the power circuit section and the heat radiation member.

In this method, a liquid waterproof resin is poured through the opening into the casing body after finishing the second step of adhering, and the waterproof resin is solidified to form a waterproof layer for sealing the power circuit section. It is possible to waterproof the power circuit section surely and easily. It is also possible to confirm a pouring state of the waterproof resin through the opening.

BRIEF DESCRIPTION OF THE DRAWINGS

The features of the present invention believed to be novel and the elements characteristic of the present invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 6a is a plan view of a casing unit that is a prototype of a casing body in the circuit assembly; and FIG. 6b is a cross section of a shape retention member taken along line A—A in FIG. 6a.

DETAILED DESCRIPTION OF EXEMPLARY EMBODIMENTS

Figure 1:
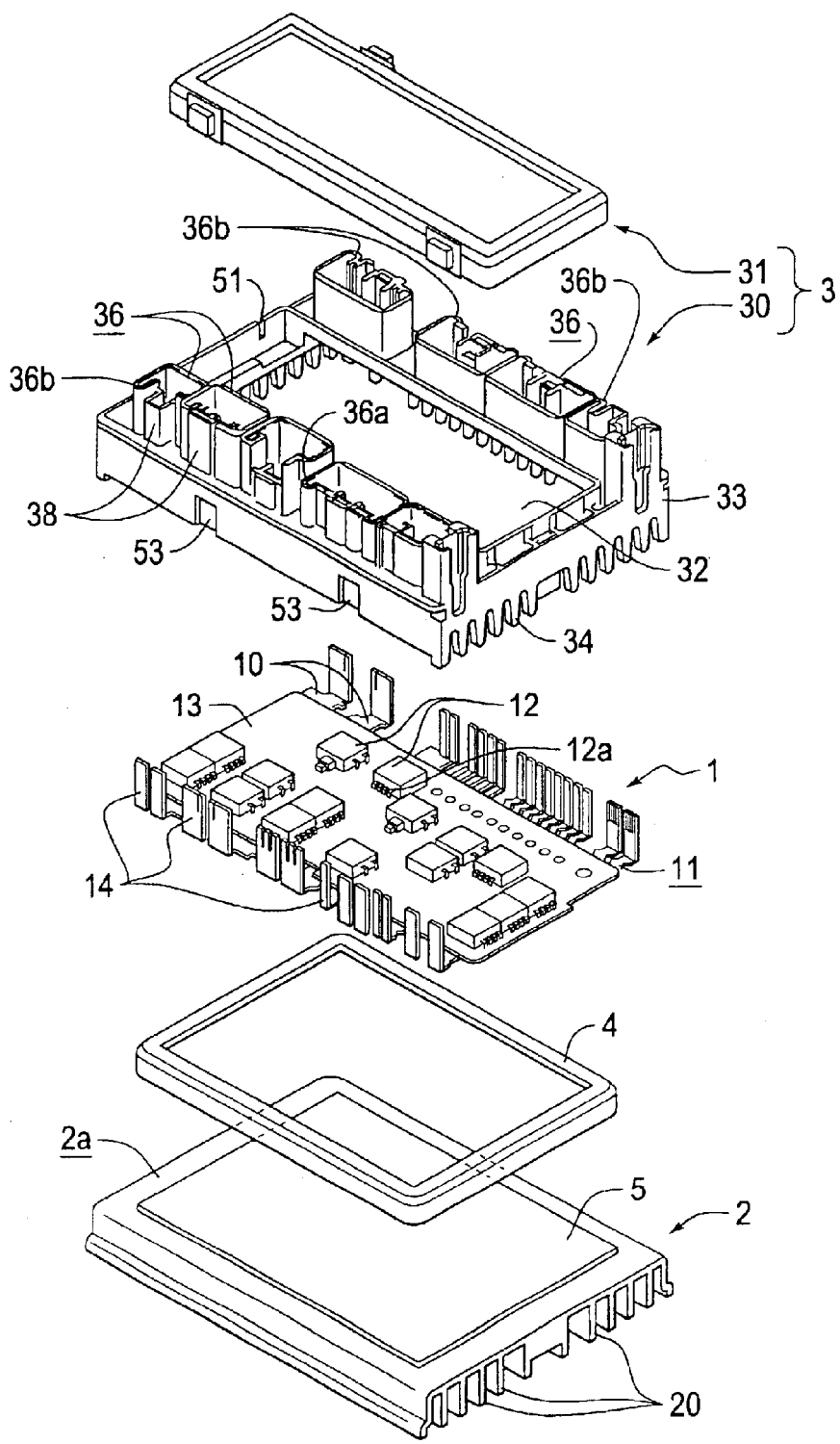
FIG. 1 is an exploded perspective view of an embodiment of a circuit assembly in accordance with the present invention.

In describing the exemplary embodiments of the present invention, reference will be made herein to FIGS. 1 to 6 of the drawings in which like numerals refer to like features of the invention. Features of the invention are not necessarily shown to scale in the drawings.

Referring now to the drawings, embodiments of a casing unit for a circuit assembly and a method for producing the circuit assembly in accordance with the present invention will be described below. An example in which the present invention is applied to a circuit assembly is described here. The circuit assembly distributes an electrical power supplied from a common power source on a vehicle or the like to a plurality of electrical loads.

FIG. 1 is an exploded perspective view of an embodiment of a circuit assembly in accordance with the present invention. The circuit assembly comprises a power circuit section 1 including a plurality of bus bars 10, a heat radiation member 2 on which the power circuit section 1 is arranged through an insulation layer 5, and a casing body 30 for protecting the power circuit section 1 from the outside. The casing body 30 and heat radiation member 2 are coupled to each other to clamp a seal member 4 for a resin disposed in the casing body 30.

The power circuit section 1 includes a control circuit board 13 and a plurality of bus bars 10 arranged on and adhered to a rear side (a lower surface in FIG. 1) of the control circuit board 13. The bus bars 10 constitute the power circuit section 1.

The bus bars 10 include input bus bars connected to an electrical source and output bus bars for supplying an electrical power to external elements. A plurality of switching devices are interposed between the input bus bars and the output bus bars. Such switching devices include, for example, field-effect transistors (FETs), large scale integrated circuits (LSIs), thyristors, relay switches, or the like.

A control circuit for controlling the switching operations of the respective switching devices 12 is incorporated in the control circuit board 13. The switching devices 12 electrically interconnect the control circuit and the power circuit. In more detail, a control terminal (a gate terminal in the FET) of the switching device 12 is directly mounted on the control circuit board 13. An electrically conducting terminal (a drain terminal or a source terminal in the FET) is mounted on a suitable bus bar 10 through a mounting through-hole provided in the control circuit board 13.

A portion of each bus bar 10 projecting outwardly from the control circuit board 13 is folded upwardly to form each external connection terminal 14. The external connection terminals 14 include, for example, an input terminal to be connected to a common electrical source on a vehicle, an output terminal to be connected to an electronic unit, and a signal input terminal to which a signal for controlling the respective switching devices 12 and the like is applied.

The heat radiation member 2 is made of a material having a good heat conduction property, such as an aluminum base metal or the like and is formed into a substantially rectangle shape in plan view. The heat radiation member 2 has a flat circuit arrangement surface 2a at a front side. A plurality of heat radiation fins 20 are disposed on the right and left sides (in FIG. 2) of a bottom surface of the heat radiation member 2 and extend downwardly. A circuit arrangement area is provided on the circuit arrangement surface 2a to support the power circuit section 1. The insulation layer 5 is disposed on the circuit arrangement surface 2a so that a peripheral edge of the insulation layer 5 extends over the circuit arrangement area.

For example, the insulation layer 5 is formed by applying an adhesive having a high insulation property (for example, an adhesive composing an epoxy base resin, a silicone base adhesive or the like) to the circuit arrangement surface 2a and solidifying it. Alternatively, an insulation sheet may be adhered to the circuit arrangement surface 2a. In the present invention, applying an adhesive composing an epoxy base resin having high insulation and heal conduction properties to the circuit arrangement surface 2a forms the insulation layer 5.

The heat radiation fins 20 may be omitted, if desired. Alternatively, heat radiation pins may be used in place of the heat radiation fins 20 to project from a side opposite from the circuit arrangement surface 2a. The heat radiation fins 20, the heat radiation pins, or the like may be provided on their surfaces with grooves to increase their surface areas, thereby enhancing heat radiation efficiency.

Figure 2:
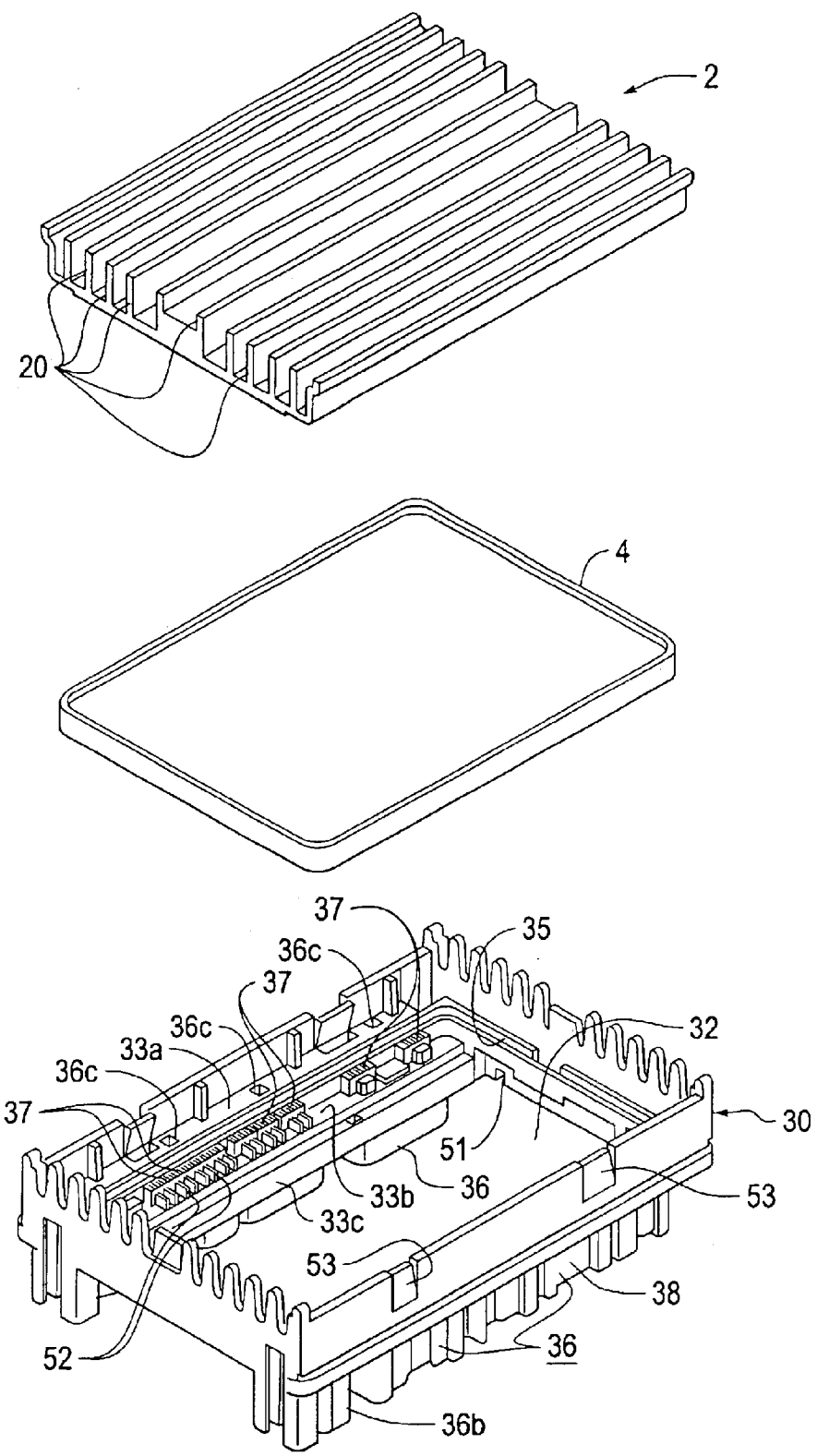
FIG. 2 is an exploded perspective view of the circuit assembly taken from a bottom side, illustrating a casing body, a seal member for a resin, and a heat radiation member.

The casing body 30 is made of a synthetic resin having a high insulation property. As shown in FIGS. 1 and 2, the casing body 30 is formed into a frame-like configuration to surround the power circuit section 1. In more detail, the casing body 30 includes a wall portion 33 whose lower end surface extends along a peripheral edge of the circuit arrangement surface 2a and a skirt 34 that extends downwardly from a periphery of the wall portion 33 to cover a peripheral side surface of the heat radiation member 2. The wall portion 33 surrounds the opening 32 so that an upper central portion of the power circuit section 1 is exposed. The lid 31 closes the opening 32 finally.

In more detail, the opening 32 exposes substantially a whole area of the control circuit board 13 in the power circuit section 1. It is possible to surely stick the power circuit section 1 through an adhesive to the circuit arrangement surface 2a on the heat radiation member 2, even if the casing body 30 has been already attached to the heat radiation member 2. In this case, the power circuit section 1 is pressed through the opening 32 onto the beat radiation member 2. This enhances a close contact between the power circuit section 1 and the circuit arrangement surface 2a.

Forming of the casing body 30 will be described below.

The seal member 4 for a resin is attached to a rear side of a periphery of the wall portion 33. The seal member 4 for a resin is formed into an endless configuration to enclose the circuit arrangement area of the heat radiation member 2.

In more detail, the wall portion 33 includes a first vertical wall part 33a, a horizontal wall part 33b extending inwardly from an end edge of the first vertical wall part 33a, and a second vertical wall part 33c extending further upwardly (in a direction opposite from the heat radiation member 2) from an end of the horizontal wall part 33b. The first vertical wall part 33a is provided in an entire lower end surface with a seal member fitting-groove 35. The seal member fitting-groove 35 surrounds the circuit arrangement area of the circuit arrangement surface 2a. The seal member 4 for a resin is fitted in the seal member fitting-groove 35.

In the present embodiment, a height of the wall portion 33 is greater than that of at least the leg-like terminal 12a of the switching device 12 mounted on the power circuit section 1. Preferably, the height of the wall portion 33 is greater than those of the respective electronic parts. The wall portion 33 can surrounds the power circuit section 1 including the respective electronic parts (such as switching devices 12 in this embodiment).

A plurality of connector housings 36 are integrated with the wall portion 33. Each connector housing 36 includes a bottom portion having terminal through-holes 37 into which the external connection terminals 14 of the power circuit section 1 are inserted, and hoods 38 that surrounds a plurality of external connection terminals 14 projecting through the terminal through-holes 37 in a direction opposite from the circuit arrangement surface 2a. The connector housing 36 together with the external connection terminal 14 constitutes an external connection connector to be connected to an external connector (for example, a connector coupled to a distal end of a cable). In this embodiment, the connector housing 36 is provided on a bottom with the horizontal wall part 33b.

Figure 3:
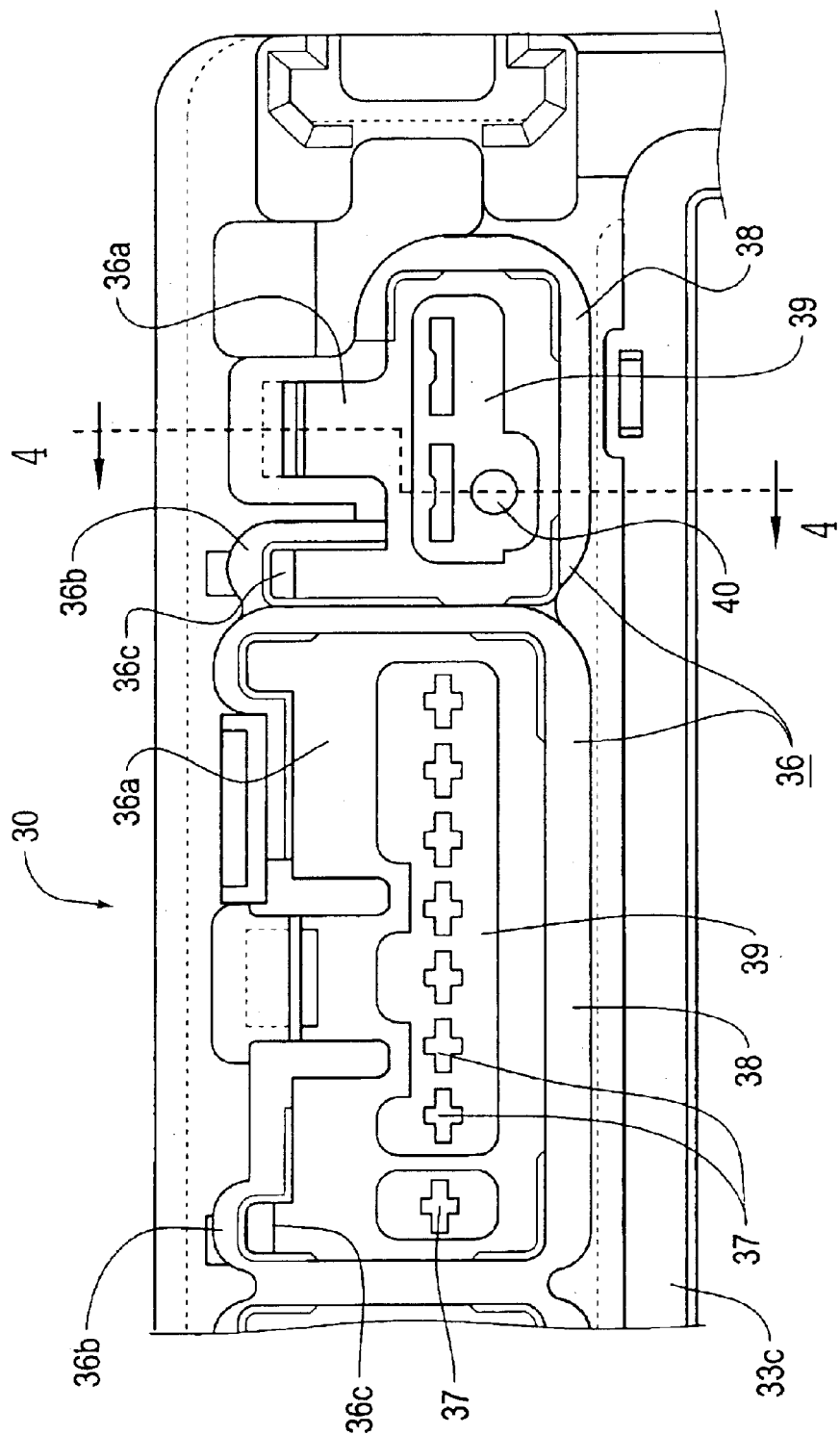
FIG. 3 is an enlarged plan view of a part of a casing body in the circuit assembly.
Figure 4:
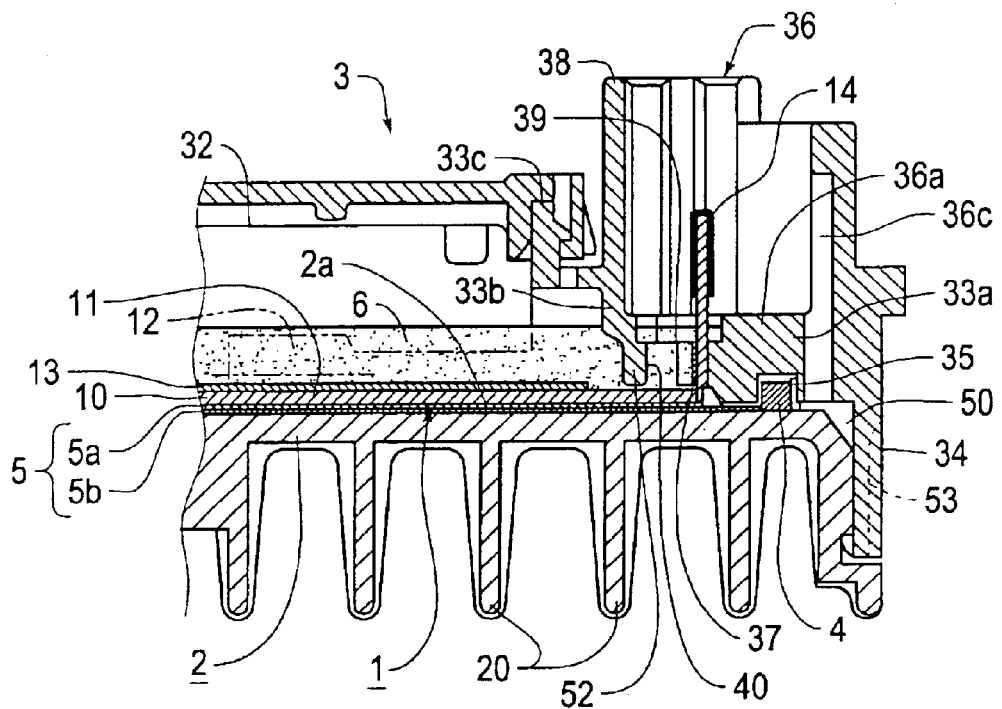
FIG. 4 is a cross section view of a circuit assembly taken in line IV—IV in FIG. 3.
Figure 5:
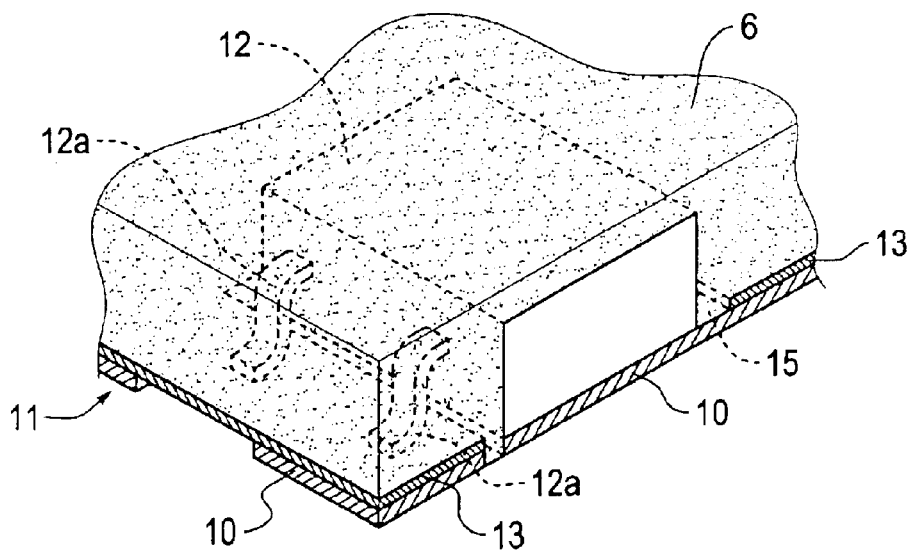
FIG. 5 is a perspective view of a waterproof layer that seals leg-like terminals of a switching device.

As shown in FIGS. 3 and 4, the connector housing 36 is provided in a bottom wall, except a connector contact surface 36a with which a distal end of another connector contacts, with a resin reservoir recess 39 depressed below (toward the heat radiation member 2) the connector contact surface 36a. The terminal through-holes 37 are provided in the area in which the resin reservoir recess 39 is formed. As shown in FIGS. 3 and 4, a resin insertion hole 40 is provided in the inside of the wall portion 33 from the resin reservoir recess 39, in particular, the underside of the horizontal wall part 33b in some connector housings 36.

The resin reservoir recess 39 reserves the waterproof resin through the terminal through-holes 37. A waterproof layer 6 described after is formed in the resin reservoir recess 39 to prevent water from entering the terminal through-holes 37, thereby effectively preventing a short circuit of the power circuit section 1. The waterproof resin overflows through the terminal through-holes 37 into the resin reservoir recess 39. On the other hand, the resin insertion hole 40 serves to assist in and promote a flow of the waterproof resin from the terminal through-holes 37. The waterproof resin flows through the resin insertion hole 40 into the resin reservoir recess 39.

In the case where the connector housing 36 is disposed vertically in the drawing, a lower end of the connector housing 36 extends outwardly. A drainage hole 36c is provided in the horizontal wall part 33b within the outwardly extending portion 36b of the connector housing 36. The drainage hole 36c opens at the outside of the resin seal member 4 and at the side of the heat radiation member 2. The drainage hole 36c serves to drain water reserved in the connector housing 36. The water drained from the drainage hole 36c flows through a drainage passage 50 defined between the heat radiation member 2 and the casing body 30 to the outside.

In the case where the circuit assembly is disposed vertically in the drawing, the second vertical wall part 33c is provided in a lower portion with a drainage notch 51 (FIG. 1). The water drainage notch 51 is disposed at the same level as or above a surface of the waterproof layer 6. The horizontal wall part 33b is provided on a rear side with a stop projection 52 for stopping the bus bars 10 constituting the external connection terminals 14.

The skirt 34 is formed into a frame-like configuration surrounding a periphery of the heat radiation member 2. A pair of opposed sidewalls of the skirt 34 are formed into projections and depressions corresponding to the heat radiation fins 20. The skirt 34 is provided with latch pawls 53 for engaging portions corresponding to the heat radiation member 2. The latch pawls 53 firmly couple the casing body 30 and the heat radiation member 2 to each other.

The lid 31 is formed into a plate-like configuration corresponding to the opening 32 in the casing body 30. The lid 31 is attached to the casing body 30 by mechanical engagement means (not shown) or chemical adhering means such as an adhesive. Although the lid 31 may be omitted, if desired, it will be preferable to provide the lid 31 to protect the power circuit section 1.

The seal member 4 for a resin is formed into an annular configuration that surrounds the circuit arrangement area. The seal member 4 for a resin can be fitted closely in the seal member fitting-groove 35. The seal member 4 for a resin serves to prevent the waterproof resin from leaking out from the casing body 30 when pouring a liquid waterproof resin described after, until the liquid waterproof resin is solidified. Preferably, seal member 4 for a resin is made of a foam rubber having closed cells.

Next, a method for producing the circuit assembly will be described below.

1) Parts producing steps:

The power circuit section 1, heat radiation member 2, and casing unit 3 shown in FIGS. 6a and 6b are produced individually.

The casing unit 3 is a prototype of the casing body 30. The casing unit 3 includes a shape retention member 38 in addition to the wall portion 33 and skirt 34 of the casing body 30. The shape retention member 38 extends across the opening 32 in a width direction and at an intermediate position in a longitudinal direction. The shape retention member 38 couples two peripheral portions around the opening 32 (opposed portions around the opening at an intermediate position in a longitudinal direction).

In the illustrated embodiment, a member body 38a of the shape retention member 38 is formed into a crisscross configuration in cross section, as shown in FIG. 6b, in order to obtain a high modulus of section. Furthermore, the shape retention member 38 is provided on each of the opposite ends with a reduced breakable portion 38b having a cross section smaller than that of the member body 38a The opposite ends include portions adjacent the peripheral edge around the opening 32 enclosed by the wall portion 33. For example, a torsion force about an axis on the member body 38a will shear the reduced breakable portion 38b. That is, the member body 38a of the shape retention member 38 is cut off from the wall portion 33.

Pouring a heated molten synthetic resin into a mold having an interior of a corresponding configuration produces the casing unit 3. Preferably, the synthetic resin is selected from a material having good insulation and formable properties, such as a PBT (polybutylene terephthalate) containing a glass, and a thermoplastic resin. If the shape retention member 38 is formed integrally with the wall portion 33 and skirt 34, it is possible to eliminate shrinkage cavities generated in the casing body after forming step. This result holds even if an area of the opening 32 is great, as shown in FIG. 6. Consequently, it is possible to keep a whole of the casing body in a normal shape.

After forming, when a temperature of the casing unit lowers to a stable condition, the shape retention member 38 is removed. It is possible to maintain the casing body in a suitable shape, to form the large opening, and to perform a work of utilizing the opening 32 (described after). A step of removing the shape retention member 38 may be carried out at any time after cooling the casing unit 3. That is, it may be performed after bringing the casing unit 3 into a stable condition. For example, it may be carried out before the following assembling step or immediately before the assembling step. Generally, it is preferable to withhold the shape retention member 38 from being removed. Two hours or so after forming will be as a guideline.

The shape retention member 38 may be left if it does not interfere with the following step.

The shape retention member 38 may be formed into any configuration, if desired. For example, if the opening 32 is substantially a square shape, the shape retention member 38 may be formed into a crisscross configuration having a lateral beam and a longitudinal beam across the opening 32. In summary, the shape retention member 38 may be set to be any shape so long as it can reinforce the entire casing unit effectively. The shape retention member 38 may be formed into any cross section, such as a crisscross section, a round H section, or the like.

The reduced breakable portion 3 8b may be omitted. It may be disposed on a boundary area between the shape retention member 38 and the periphery around the opening 32, or within an area adjacent the boundary area.

2) Assembling steps:

The seal member 4 for a resin is closely fitted in the seal member fitting-groove 35 in the casing body 30. The power circuit section 1 is attached to the casing body 30 with the external connection terminals 14 being inserted into the terminal through-holes 37. It is possible to keep an alignment of the external connection terminals 14 by attaching the power circuit section 1 to the casing body 30 beforehand.

On the other hand, an adhesive for forming the insulation layer 5 is applied to the circuit arrangement area on the heat radiation member 2. The casing body 30, with which the power circuit section 1 is incorporated, is attached to the heat radiation member 2. Then, the bus bars 10 of the power circuit section 1 contacts with the adhesive and the power circuit section 1 is joined to the circuit arrangement area on the circuit arrangement surface 2a of the heat radiation member 2 by means of the adhesive.

Moreover, suitable positions (many positions) of the control circuit board 13 in the power circuit section 1 are pressed through the opening 32 in the casing body 30 to enhance a close contact between the power circuit section 1 (through the insulation layer 5) and the circuit arrangement area on the heat radiation member 2. In more detail, the suitable positions on the power circuit section 1, in particular, the peripheries of the power circuit section 1 and the switching devices 12 are pressed through the opening 32 in the casing body 30 to firmly secure the power circuit section 1 to the circuit arrangement area on the heat radiation member 2. Thus, the bus bars 10 disposed on the rear side of the power circuit section 1 are embedded in the adhesive by pressing the power circuit section 1 to join the power circuit section 1 to the heat radiation member 2. Consequently, it is possible to prevent a short circuit between the bus bars 10 and to enhance heat conductivity between the power circuit section 1 and the heat radiation member 2. After solidifying the adhesive by heating, a complete insulation layer 5 is formed.

If the shape retention member 38 is removed from the casing unit before performing the pressing work, the shape retention member 38 will not interfere with the following pressing work, thereby performing the press working smoothly.

The latch pawls 53 of the skirt 34 engage the heat radiation member 2 to secure the casing body 30 to the heat radiation member 2. The casing body 30 may be secured to the heat radiation member 2 by mechanical fastening means such as screws, bolts, or the like, chemical means such as an adhesive, or well known attaching means. In the case where the waterproof resin having an adhesive property is used, the casing body 30 may be attached to the heat radiation member 2 temporarily.

Applying the adhesive to the heat radiation member 2 at only one time can form the insulation layer 5. However, for example, the power circuit section 1 is not stuck on the heat radiation member 2 at the first applying time of the adhesive and the adhesive is solidified, as it is, to form a lower insulation layer 5a. Then, the same or different kind of adhesive is applied to the lower insulation layer 5a to form an upper insulation layer 5b (see FIG. 4). The power circuit section 1 is stuck to the upper insulation layer 5b and then the upper insulation layer 5b is solidified. The upper and lower insulation layers 5b and 5a constitute the insulation layer 5.

For example, an epoxy base resin is preferable for an adhesive that forms the insulation layer 5. However, the other adhesive will be suitable so long as they have a good heat conduction property.

The power circuit section 1 is arranged on the circuit arrangement area on the circuit arrangement surface 2a of the heat radiation member 2 in the above step. The casing body 30 surrounds the circuit arrangement area on the circuit arrangement surface 2a of the heat radiation member 2 including the power circuit section 1 to form an enclosure wall. This enclosure wall serves as a bank for the waterproof resin to be used in the following step.

3) Waterproofing steps:

In the present embodiment, a given amount of liquid waterproof resin is poured into a space enclosed by the casing body 30 and is solidified to form the waterproof layer 6 as means for waterproofing the power circuit section 1.

In more detail, the circuit arrangement surface 2a faces upwardly and the liquid waterproof resin is poured through the opening 32 in the casing body 30 into the space enclosed by the casing body 30. The waterproof resin is poured into the space until the respective electronic parts (switching devices 12) are sealed. At this time, the waterproof resin overflows through the terminal through-boles 37 and resin insertion holes 40 into the connector housing 36, and reaches a given height in the resin reservoir recess 39.

When the waterproof resin fills the resin reservoir recess 39, the bus bar assembly 11 including the base portions of the external connection terminals 14 and the control circuit board 13 are dipped in the waterproof resin. On the other hand, since the seal member 4 for a resin surrounds the circuit arrangement area, the liquid waterproof resin does not leak out from a clearance between the heat radiation member 2 and the casing body 30.

A kind of the waterproof resin is not limited to a special material so long as it has a waterproof property. In the present embodiment, the waterproof resin in a liquid form flows into every corner in the casing body 30, thereby obtaining a complete seal. If the waterproof resin is used which has certain elasticity and shape retainability after solidifying, it will not affect the switching devices 12 and solders. A silicone base resin will be preferable in view of electrical insulation as well as heat resistance and cold resistance. The waterproof resin having a good adhesive property can omit an applying work of a primer or the like and simplify a work. Furthermore, the waterproof resin having a good heat conduction property can promote heat radiation from the waterproof layer 6 as well as the heat radiation member 2, thereby enhancing heat radiation.

Heating solidifies the filled waterproof resin to form the waterproof layer 6. The waterproof layer 6 seals at least a part of the power circuit section 1 within the casing body 30 and seals the terminal through-holes 37. At this time, it is possible for a worker to confirm a filling state of the waterproof resin and a forming state of the insulation layer through the large opening 32.

The waterproof layer 6 is not always required. For example, a combination of a seal member and the lid 31 may be used in place of the waterproof layer 6 to perform a waterproofing treatment.

After waterproofing, it is possible to protect the power circuit section 1 surely by mounting the lid 31 that covers, for example, the opening 32 in the casing body 30.

The entire disclosure of Japanese Patent Application No. 2003-036467 filed on Feb. 14, 2003 including the specification, claims, drawings and summary is incorporated herein by reference in its entirety.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. A casing unit wherein a power circuit section is adhered to a circuit arrangement surface on a heat radiation member to form a circuit assembly and a casing body is mounted on said heat radiation member, comprising:
    a casing body for covering a side portion or an upper portion of said power circuit section adhered to said circuit arrangement surface and being provided with an opening that exposes at least said upper portion of said power circuit section; and
    a shape retention member disposed across said opening for interconnecting a peripheral edge of said opening to each other at a plurality of positions;
    said casing body and shape retention member being made of a synthetic resin integrally with each other.

2. A casing unit according to claim 1, wherein a breakable reduced portion is provided on a boundary area or an adjacent area between said shape retention member and said peripheral edge around said opening, a cross section of said breakable reduced portion being smaller than that of a member body of said shape retention member.

3. A casing unit according to claim 2, wherein a plurality of connector housings are integrally provided on said peripheral edge around said opening in said casing body to interconnect said power circuit section and an external circuit to each other and said opening is formed at an inside of said connector housing.

4. A method for producing said casing unit wherein said power circuit section is adhered to said circuit arrangement surface on said heat radiation member to form said circuit assembly and said casing body is mounted on said heat radiation member, comprising the steps of: forming said casing unit according to claim 2 by filling a heated molten synthetic resin into a mold; and removing said shape retention member from said casing unit after cooling said casing unit.

5. A method for producing said circuit assembly wherein said power circuit section having said power circuit is adhered to said heat radiation member and said synthetic resin casing body is mounted on said heat radiation member to protect said power circuit section from the outside, comprising the steps of: producing said power circuit section, said heat radiation member, and said casing unit according to claim 2, respectively; and adhering said power circuit section to said heat radiation member and adhering said casing unit to said heat radiation member; in the first step of producing said power circuit section, forming said casing unit including said shape retention member by filling a heated molten synthetic resin into a mold, and removing said shape retention member from said casing unit after cooling said casing unit and before finishing the second step of adhering; in the second step of adhering, pressing said power circuit section onto said heat radiation member through said opening from which said shape retention member is removed, with an adhesive being interposed between said power circuit section and said heat radiation member, thereby enhancing a close contact between said power circuit section and said heat radiation member.

6. A casing unit according to claim 1, wherein a plurality of connector housings are integrally provided on said peripheral edge around said opening in said casing body to interconnect said power circuit section and an external circuit to each other and said opening is formed at an inside of said connector housing.

7. A method for producing said casing unit wherein said power circuit section is adhered to said circuit arrangement surface on said heat radiation member to form said circuit assembly and said casing body is mounted on said heat radiation member, comprising the steps of:

forming said casing unit according to claim 6 by filling a heated molten synthetic resin into a mold; and removing said shape retention member from said casing unit after cooling said casing unit.

8. A method for producing said circuit assembly wherein power circuit section having said power circuit is adhered to a heat radiation member and said synthetic resin casing body is mounted on said heat radiation member to protect said power circuit section from the outside, comprising the steps of:

producing said power circuit section, said heat radiation member, and said casing unit according to claim 6, respectively; and adhering said power circuit section to said heat radiation member and adhering said casing unit to said heat radiation member;

in the first step of producing said power circuit section, forming said casing unit including said shape retention member by filling a heated molten synthetic resin into a mold, and removing said shape retention member from said casing unit after cooling said casing unit and before finishing the second step of adhering;

in the second step of adhering, pressing said power circuit section onto said heat radiation member through said opening from which said shape retention member is removed, with an adhesive being interposed between said power circuit section and said heat radiation member, thereby enhancing a close contact between said power circuit section and said heat radiation member.

9. A method for producing said casing unit wherein said power circuit section is adhered to said circuit arrangement surface on said heat radiation member to form said circuit assembly and said casing body is mounted on said heat radiation member, comprising the steps of:

forming said casing unit according to claim 1 by filling a heated molten synthetic resin into a mold; and removing said shape retention member from said casing unit after cooling said casing unit.

10. A method for producing said circuit assembly wherein said power circuit section having said power circuit is adhered to said heat radiation member and said synthetic resin casing body is mounted on said heat radiation member to protect said power circuit section from the outside, comprising the steps of: producing said power circuit section, said heat radiation member, and said casing unit according to claim 1, respectively; and adhering said power circuit section to said heat radiation member and adhering said casing unit to said heat radiation member; in the first step of producing said power circuit section, forming said casing unit including said shape retention member by filling a heated molten synthetic resin into a mold, and removing said shape retention member from said casing unit after cooling said casing unit and before finishing the second step of adhering; in the second step of adhering, pressing said power circuit section onto said heat radiation member through said opening from which said shape retention member is removed, with an adhesive being interposed between said power circuit section and said heat radiation member, thereby enhancing a close contact between said power circuit section and said heat radiation member.

11. A method for producing said circuit assembly according to claim 10, wherein a liquid waterproof resin is poured through said opening into said casing body after finishing said second step of adhering, and said waterproof resin is solidified to form a waterproof layer for sealing said power circuit section.

* * * * *